United States Patent [19]
DeLange

[11] Patent Number: 6,091,259
[45] Date of Patent: *Jul. 18, 2000

[54] APPARATUS FOR ACCELERATING DIGITAL SIGNAL TRANSITIONS USING A TRANSITION ACCELERATION CIRCUIT AND A TRANSITION TERMINATION CIRCUIT

[75] Inventor: Willem J. DeLange, Los Altos, Calif.

[73] Assignee: Sun Microsystems, Inc., Palo Alto, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/924,020

[22] Filed: Aug. 29, 1997

[51] Int. Cl.$^7$ ........................... H03K 19/01; H03K 17/16; H03K 19/003

[52] U.S. Cl. .................................. 326/17; 326/27

[58] Field of Search .................. 326/17, 27, 87, 326/26, 83, 86, 121; 327/310; 375/360

[56] References Cited

U.S. PATENT DOCUMENTS

| | | | |
|---|---|---|---|
| 4,680,487 | 7/1987 | Kobayashi | 326/87 |
| 4,731,553 | 3/1988 | Van Lehn et al. | 326/27 |
| 4,820,942 | 4/1989 | Chan | 327/310 |
| 4,825,101 | 4/1989 | Walters | 326/87 |
| 4,954,729 | 9/1990 | Urai | 326/27 |

FOREIGN PATENT DOCUMENTS 653844  5/1995  European Pat. Off. .

*Primary Examiner*—Michael Tokar
*Assistant Examiner*—Patrick Wamsley
*Attorney, Agent, or Firm*—William S. Galliani; Pennie & Edmonds LLP

[57] ABSTRACT

A circuit for accelerating digital signal transitions includes an input/output node to receive a digital input signal. A transition termination circuit is connected to the input/output node to generate a transition termination signal when the digital input signal approaches a final signal level. A transition acceleration circuit is connected to the input/output node and the transition termination circuit. The transition acceleration circuit is activated to accelerate the digital input signal to a full digital signal level when the digital input signal achieves an initial signal transition level and is deactivated when the transition termination signal is received.

17 Claims, 5 Drawing Sheets

6,091,259

APPARATUS FOR ACCELERATING DIGITAL SIGNAL TRANSITIONS USING A TRANSITION ACCELERATION CIRCUIT AND A TRANSITION TERMINATION CIRCUIT

BRIEF DESCRIPTION OF THE INVENTION

This invention relates generally to the processing of digital signals in Very Large Scale Integrated (VLSI) circuits. More particularly, this invention relates to improving signal speed at critical nodes in a VLSI circuit.

BACKGROUND OF THE INVENTION

The number and length of signal paths in VLSI circuits continues to increase. Signal repeaters are used in VLSI circuits to maintain signal strength through long lines. That is, a long line is broken into smaller segments and signal repeaters are used to drive digital signals between the segments. While signal repeaters are useful in maintaining digital signal levels on long signal paths, they can be problematic because their intrinsic delay may reduce signal speed. They can also be problematic because they cannot be used with bi-directional lines.

Certain nodes in a signal path must receive a signal at a specified time in order for a VLSI circuit to operate properly. A traditional approach to insuring fast signal speeds at critical nodes is to provide a relatively wide signal line and increased spacing between adjacent signal lines. The problem with this approach is that it is relatively space-intensive.

In view of the foregoing, it would be highly desirable to provide a technique for accelerating digital signals that does not rely upon the relatively space-intensive solution of widening signal line routing pitches.

SUMMARY OF THE INVENTION

A circuit for accelerating digital signal transitions includes an input/output node to receive a digital input signal. A transition termination circuit is connected to the input/output node to generate a transition termination signal when the digital input signal approaches a final signal level. A transition acceleration circuit is connected to the input/output node and the transition termination circuit. The transition acceleration circuit is activated to accelerate the digital input signal to a full digital signal level when the digital input signal achieves an initial signal transition level and is deactivated when the transition termination signal is received.

The invention can be used to improve speed on any signal line. For example, the circuit can be used instead of widening a signal line. The circuit may be used to speed-up word lines in random access memory arrays. The circuit is advantageously exploited when there is not space for a repeater in the middle of a long signal line. In such a case, the circuit of the invention can be placed near a receiver. The invention may also be used at the inputs of unbuffered multiplexers where buffers cannot be used because of their intrinsic delay. Advantageously, the invention can be used on unidirectional and bi-directional lines.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
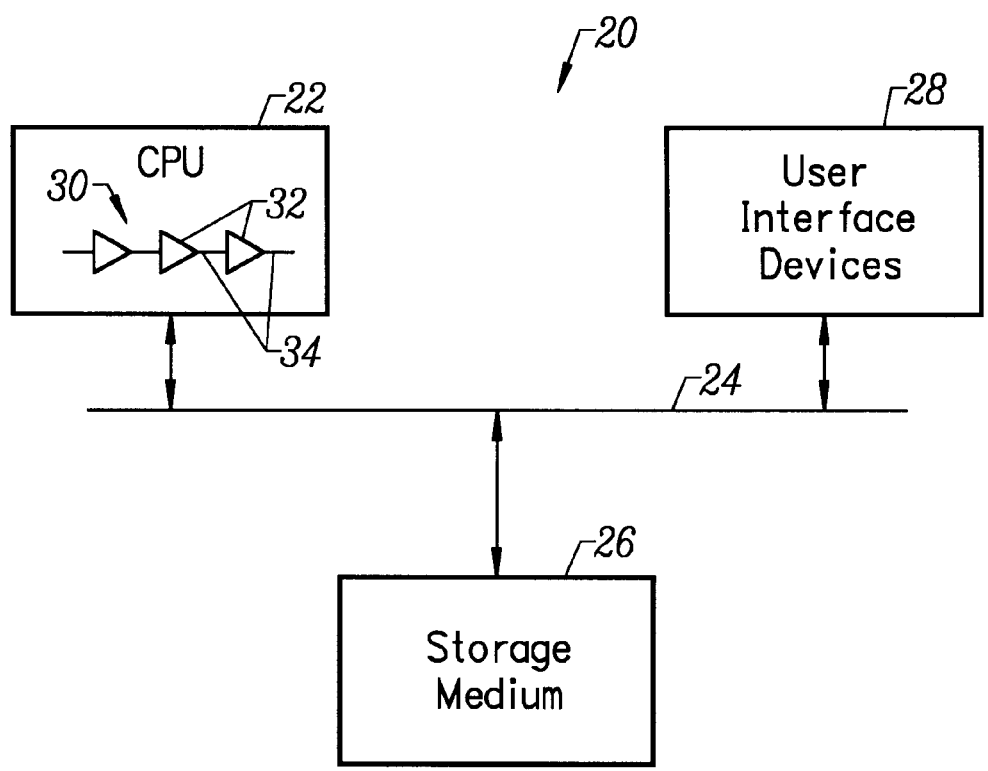
FIG. 1 illustrates a general purpose computer utilizing the digital signal transition acceleration circuit of the invention.

FIG. 1 illustrates a computer 20 with a central processing unit (CPU) 22. The CPU 22 is connected to a bus 24 to achieve communication with a storage medium 26, generally including primary memory storage and secondary memory storage. The CPU 22 also uses the bus 24 to communicate with user interface devices 28, generally referring to any computer input or output device. The interaction of a CPU 22, bus 24, storage medium 26, and user interface devices 28 is known in the art. The invention is directed toward a signal line 30 used on the CPU 22. The signal line 30 includes a set of digital signal transition acceleration circuits 32 that are connected by conductors 34. Each digital signal transition acceleration circuit 32 is used to insure that a digital signal arrives at a critical node at a required time.

Figure 2:
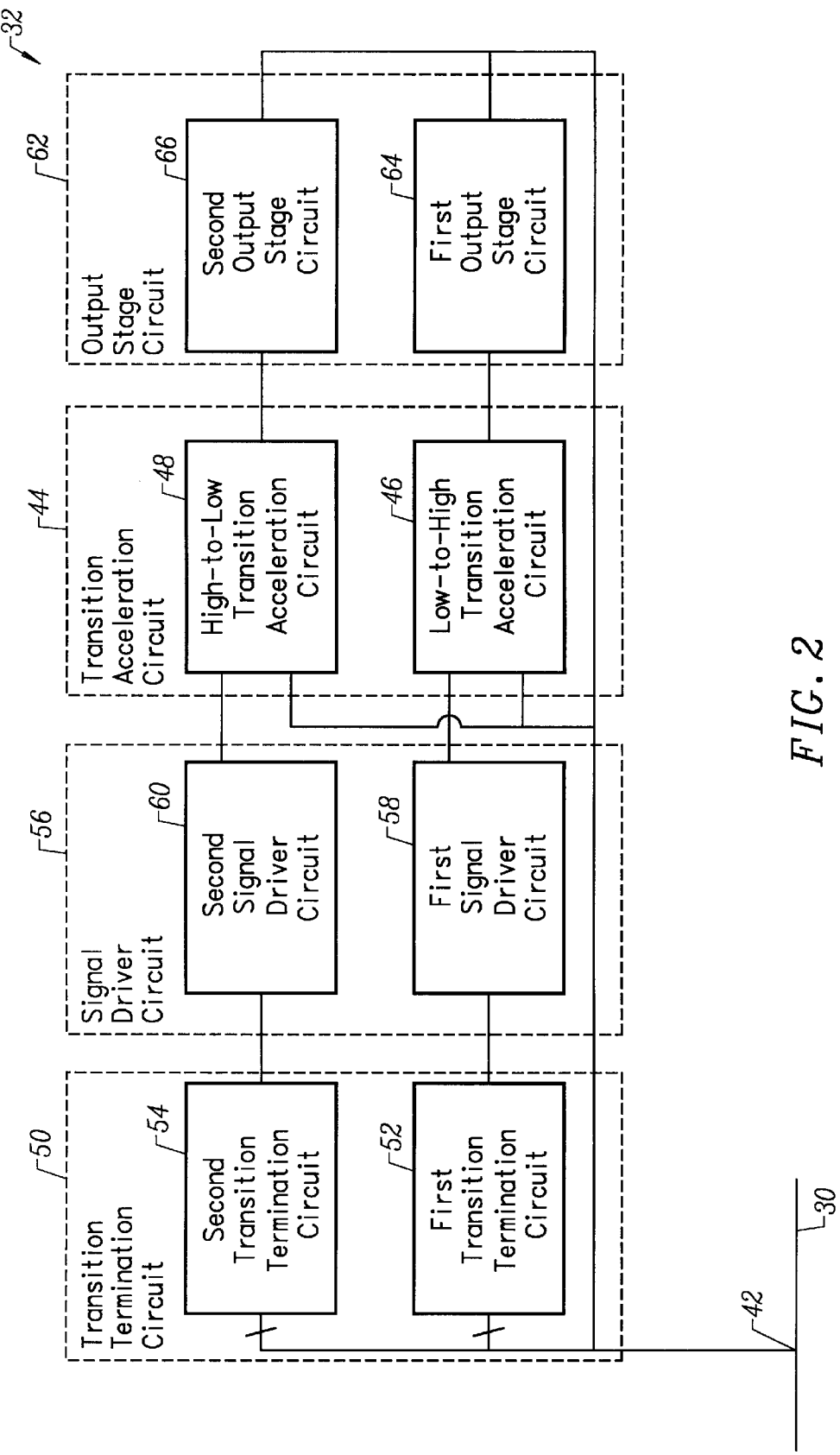
FIG. 2 is a generalized schematic illustrating the different functional components of a digital signal transition acceleration circuit constructed in accordance with an embodiment of the invention.

FIG. 2 illustrates a digital signal transition acceleration circuit 32 constructed in accordance with an embodiment of the invention. The circuit 32 is connected to the signal line 30 at an input/output node 42. The circuit 32 includes a transition acceleration circuit 44, which identifies an initial signal transition level and accelerates the signal transition to a full signal level, in the manner described below. The transition acceleration circuit 44 preferably includes a low-to-high transition acceleration circuit 46 and a high-to-low transition acceleration circuit 48.

The circuit 32 also includes a transition termination circuit 50, which generates a transition termination signal when the original input signal approaches a final signal level. The transition acceleration circuit 44 responds to the transition termination signal by stopping the acceleration of the digital pulse signal transition. Preferably, the transition termination circuit 50 includes a first transition termination circuit 52 and a second transition termination circuit 54.

The circuit 30 may be implemented with a signal driver circuit 56 positioned between the transition termination circuit 50 and the transition acceleration circuit 44. The signal driver circuit 56 may include a first signal driver circuit 58 and a second signal driver circuit 60.

An output stage circuit 62 may also be used in accordance with embodiments of the invention. The output stage circuit 62 may include a first output stage circuit 64 and a second output stage circuit 66. The output from the output stage circuit 62 is applied to the input/output node 42.

In sum, the digital signal transition acceleration circuit 30 includes two signal paths, one for low-to-high signal transitions and one for high-to-low signal transitions. The transition acceleration circuit identifies an initial signal transition in an input digital signal and accelerates it to a full signal level until the transition termination signal is received. As a result, the signal transition at the input/output node 42 is accelerated.

Figure 3:
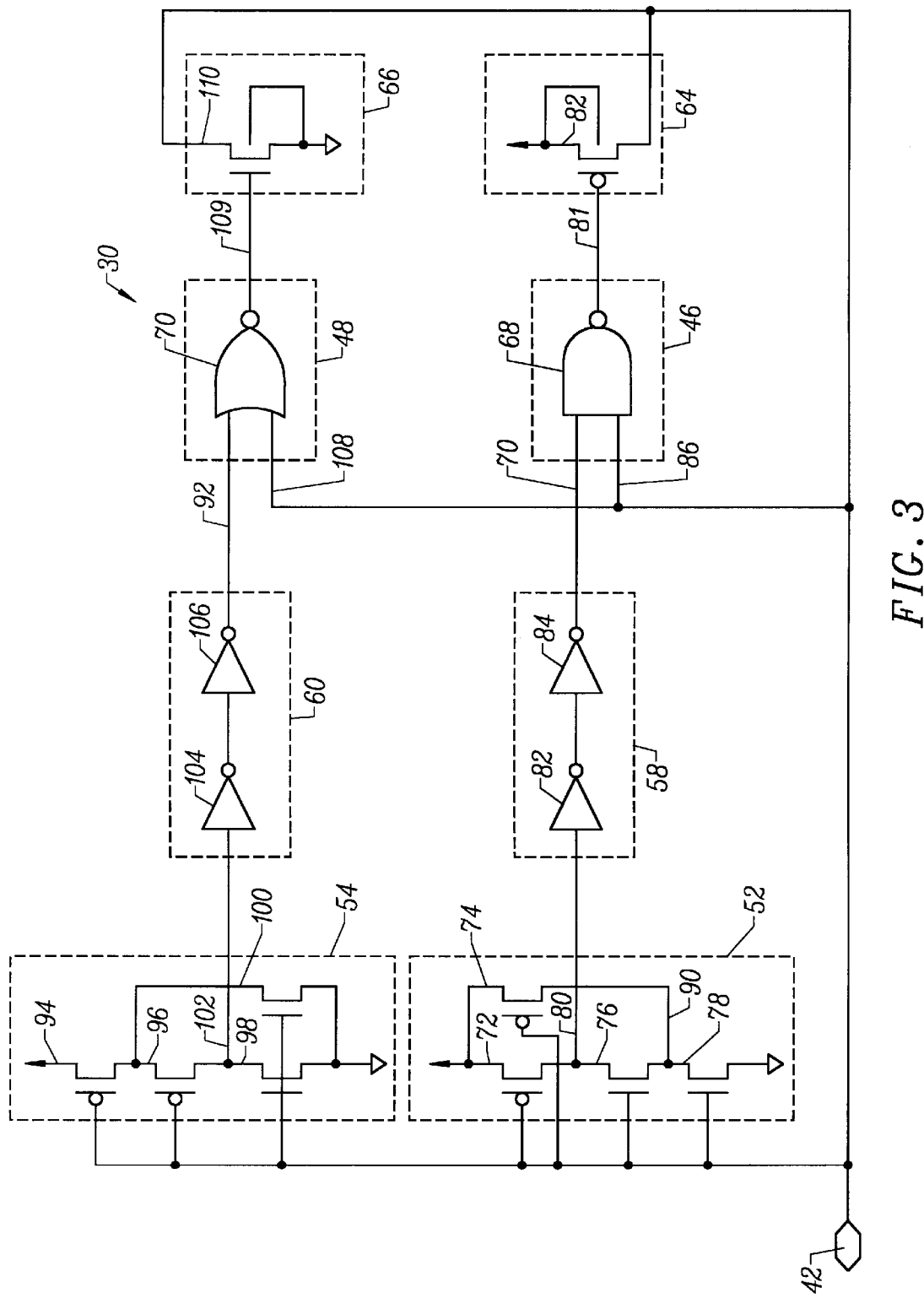
FIG. 3 is a detailed schematic illustrating an implementation of the circuit of FIG. 2.

The operation of the invention is more fully appreciated with reference to FIG. 3. FIG. 3 illustrates a specific implementation of the generalized circuit of FIG. 2. Those skilled in the art will recognize that the circuit of FIG. 3 is one of many feasible designs for implementing the operations of the invention.

FIG. 3 illustrates that the input/output node 42 is connected to the low-to-high transition acceleration circuit 46, implemented in this example as a logical NAND gate 68, and to the high-to-low transition acceleration circuit 48, implemented in this example as a logical NOR gate 70. In the case of a low-to-high digital signal transition node 70 has a digital high input signal. The digital high signal is generated by the first transition termination circuit 52. In particular, the digital low signal keeps PMOS transistors 72 and 74 on, while it keeps transistors 76 and 78 off. As a result, a digital high signal is driven onto node 80. The digital high signal is driven through the first signal driver circuit 58, which is implemented with inverters 82 and 84. Inverters 82 and 84 are selected to create a desired delay to contribute to the desired signal transition acceleration period. Thus, the combination of the processing of the transition termination circuit 52, the signal driver circuit 58, and the low-to-high transition acceleration circuit 46 establishes the acceleration period.

The NAND gate 68 is implemented to have a relatively low trip point at node 86. In other words, the NAND gate 68 will recognize a minimally high digital signal level (e.g., 20–30% of a standard digital high signal level). Thus, when the low-to-high digital signal from the input node 42 is received at node 86, it is immediately processed along with the digital high input signal at node 70. The two digital high input signals cause the NAND gate 68 to generate a digital low signal. The digital low signal turns on the PMOS transistor 82 of the first output stage circuit 64. As a result, a digital high signal is applied to the input/output node 42.

At this processing point, a digital high signal is being accelerated to the input/output node 42. This acceleration process is maintained until a transition termination signal, in the form of a digital low signal, is received at node 70. As indicated above, the transition termination signal is generated by the first transition termination circuit 52. On a low-to-high transition, the PMOS transistors 72 and 74 are initially on. Transistor 72 pulls node 80 high, while transistor 74 sources current to node 90. This enhances the gate-to-source voltage of transistor 76. Thus, it takes a larger gate signal to turn-on transistor 76. In particular, transistor 76 will not turn-on until approximately 70 to 80% of the digital high signal level is received. The first transition termination circuit 52 may be viewed as a Schmitt trigger with a high trip point.

When the requisite signal level is received, transistors 72 and 74 are turned-off, while transistors 76 and 78 are turned-on and thereby pull node 80 to a digital low value. The digital low value is then driven through the first signal driver circuit 58 and is applied to the input node 70 of NAND gate 68. This causes the NAND gate to generate a digital high signal, which turns-off PMOS transistor 82. As a result, the signal on the input/output node 42 is no longer being driven high by the acceleration circuit since PMOS device 82 is turned-off.

The digital signal transition acceleration circuit 30 also includes a signal path for processing high-to-low signal transitions. In the case of a high-to-low signal transition, node 92 is originally at a digital low value. The reason for this is that the digital high signal causes PMOS transistors 94 and 96 of the second transition termination circuit to be turned-off. Further, the digital high signal keeps NMOS transistors 98 and 100 turned-on, keeping node 102 at a digital low value. The digital low value is driven through the inverters 104 and 106 of the second signal driver circuit 60. Inverters 104 and 106 are selected to contribute a desired delay to generate the desired signal transition acceleration period. Thus, the combination of the processing of the transition termination circuit 54, the signal driver circuit 60, and the high-to-low transition acceleration circuit establishes the acceleration period.

The high-to-low transition acceleration circuit 48 is implemented to recognize a minimally low digital signal level (e.g., 70–80% of a digital high signal). Thus, when node 108 of the NOR gate 70 receives an initial signal transition from a digital high value to a digital low value, the output of the NOR gate 70 produces a digital high value in response to the two digital low input signals. The digital high value turns-on transistor 110, which pulls the input/output node 42 to a digital low value. In other words, the high-to-low signal transition is accelerated at input/output node 42.

The second transition termination circuit 54 operates in a manner that is similar to the operation of the first transition termination circuit 52. Pull-down transistor 100 keeps the source-to-drain voltage of transistor 96 low. Thus, a relatively low voltage level is needed to turn-on transistor 96. Transistor 96 will only turn-on when the digital high signal deteriorates to approximately 20 to 30% of its original value. At that time, transistors 96 and 94 drive a digital high signal onto node 102. The digital high signal is then driven through the inverters 104 and 106 of the second signal driver circuit 60. The digital high signal on node 92 causes the output of NOR gate 70 to go to a digital low value. As a result, transistor 110 turns-off. Therefore, the output signal on input/output node 42 is no longer pulled low by the NMOS device 110.

Figure 4:
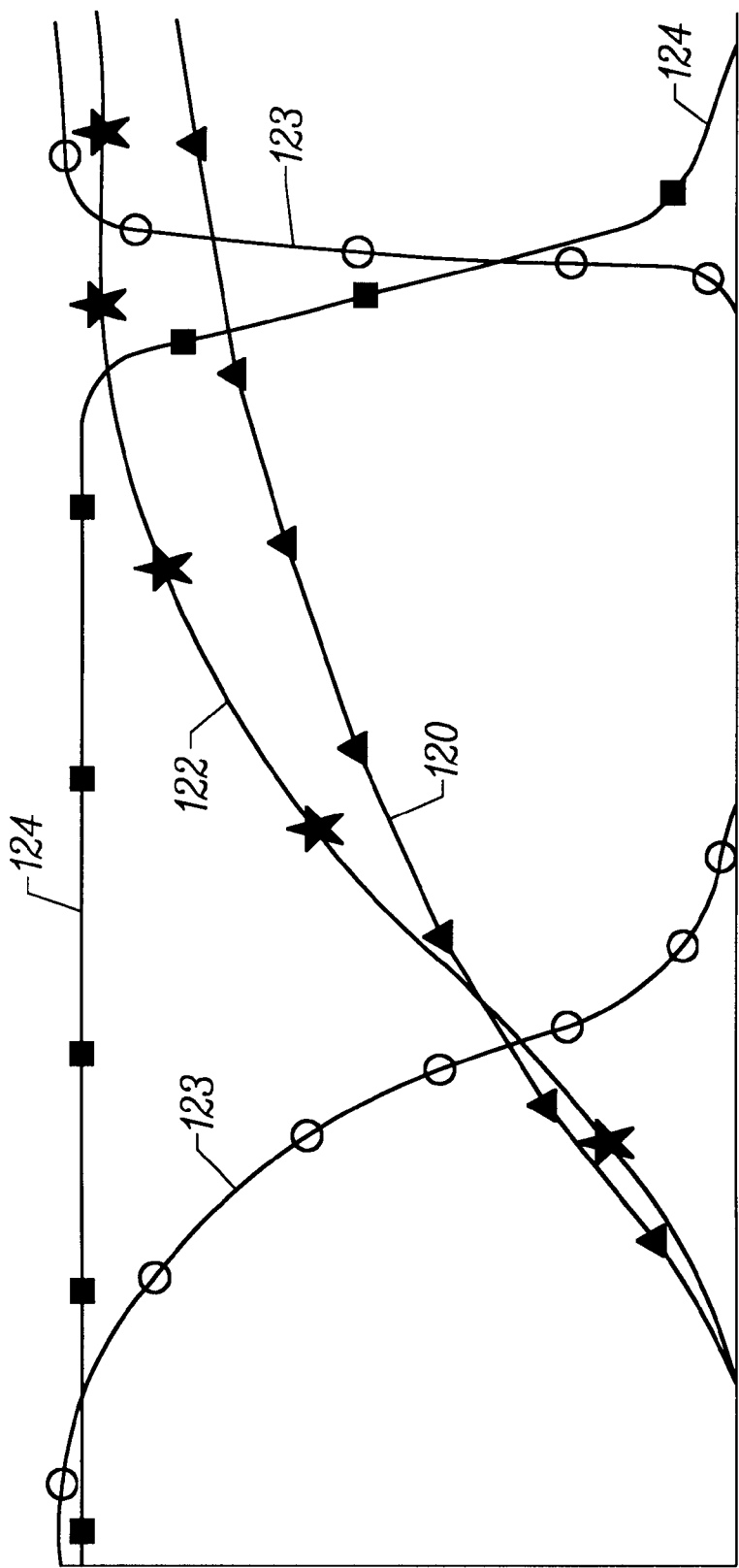
FIG. 4 is a set of waveforms illustrating the operation of the circuit of FIG. 3.

The operation of the invention is more fully appreciated with reference to FIG. 4, which illustrates various signals processed in connection with a low-to-high signal transition. Waveform 120 is an input signal at a node of a circuit that does not utilize the transition acceleration circuit of the invention. Waveform 122 is an input signal at the same node when the transition acceleration circuit of the invention is used. Waveform 122 illustrates that a digital high value is accomplished more rapidly when the circuit of the invention is used.

The initial transition of the input signal causes the output of the low-to-high transition acceleration circuit 46 to go from a digital high value to a digital low value, as shown with waveform 123. This digital low value causes transistor 82 to turn-on, thereby pulling the output signal high. Observe in FIG. 4 that after waveform 123 descends to a digital low value, waveform 122 rises to a digital high value at a faster rate than the corresponding signal 120, which does not have the benefit of the circuit of the invention. Waveform 122 is initially beneath waveform 120 because the transition acceleration circuit represents a small loading at the node.

Waveform 124 shows the transition termination signal at a digital high value until the input signal 120 reaches a certain value, causing transistors 76 and 78 to turn-on, pulling node 80 low, causing the down-turn in the transition termination signal 124 on node 70. This signal transition causes the output of the low-to-high transition acceleration circuit 46 to toggle, as shown with the up-turn in waveform 123. Thus, transistor 82 turns-off, causing acceleration to stop. However, the input/output node 42 is still being driven high at this time by the driver on the signal line to which the acceleration circuit is connected.

Figure 5:
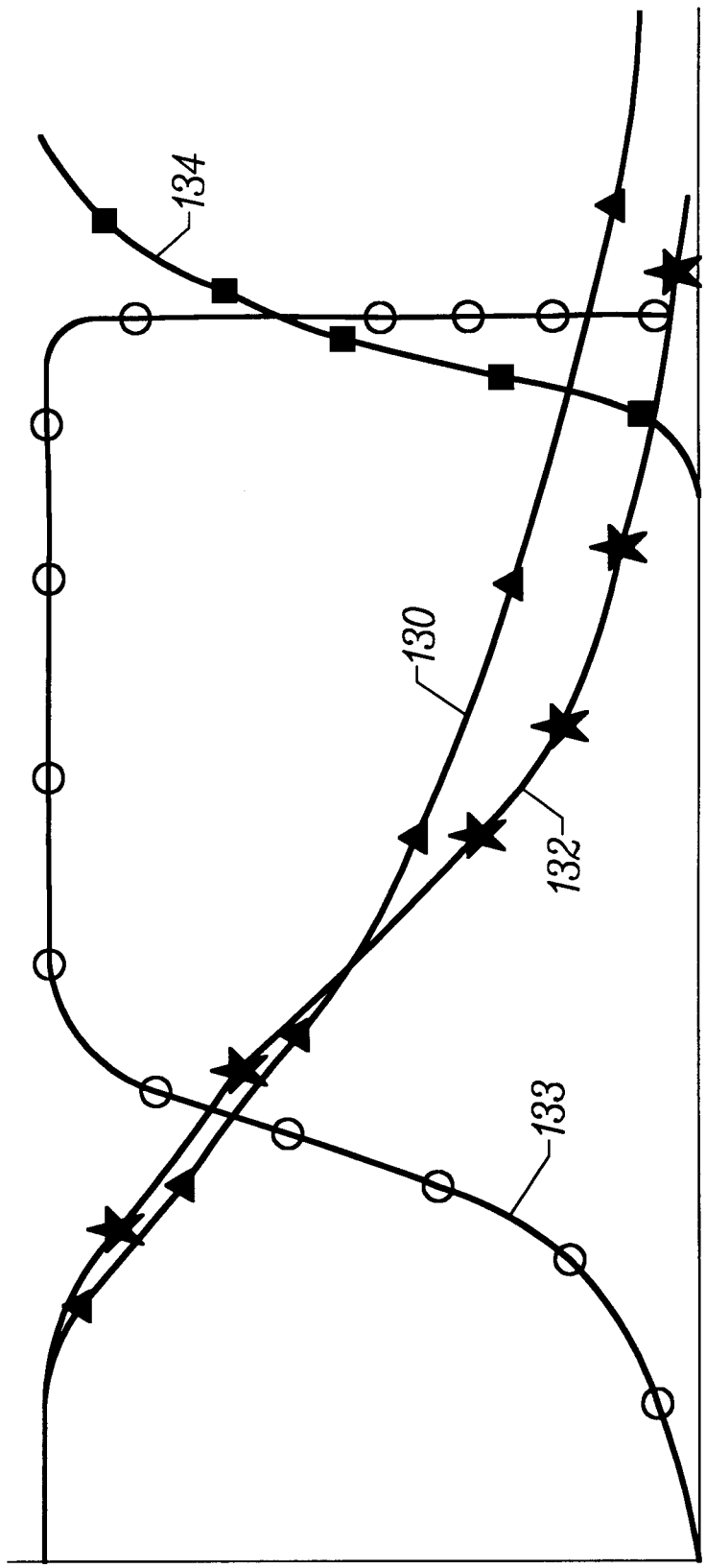
FIG. 5 is a set of waveforms illustrating the operation of the circuit of FIG. 3.

FIG. 5 illustrates the various signals processed in connection with a high-to-low signal transition. Waveform 130 is a high-to-low input signal at a node that does not have the acceleration circuit of the invention. Waveform 132 is a corresponding high-to-low input signal at the same node when the acceleration circuit of the invention is used. It is readily apparent that the acceleration circuit of the invention provides an accelerated transition from a digital high to a digital low value.

The initial input signal transition causes the output of the high-to-low transition acceleration circuit 48 to produce a digital high signal, as shown with waveform 133. This digital high signal turns-on transistor 110, pulling the output signal low, as shown with waveform 132. That is, waveform 132 descends more rapidly than waveform 130 when the signal 133 achieves a digital high value.

When the input signal reaches a predetermined low value, the second transition termination circuit 54 generates a digital high signal, as shown with waveform 134. This digital high signal causes the high-to-low transition acceleration circuit 48 to produce a digital low signal, as shown with the falling portion of waveform 133. This falling signal causes transistor 110 to shut-off. Therefore, the acceleration process is completed.

FIGS. 4 and 5 illustrate that the output of the transition acceleration circuit 44 is initially established by the input signal. The output value of the transition acceleration circuit 44 is then toggled when the transition termination signal is received. Thus, the transition acceleration circuit 44 produces two digital states during a signal transition. These two digital states are used to control the output stage circuit 62.

Those skilled in the art will recognize many advantages associated with the present invention. The invention can be used to improve speed on any signal line. For example, the circuit can be used instead of widening a signal line. The circuit may be used to speed-up word lines in random access memory arrays. The circuit is advantageously exploited when there is not space for a repeater in the middle of a long signal line. In such a case, the circuit of the invention can be placed near a receiver. The invention may also be used at the inputs of unbuffered multiplexers where buffers cannot be used because of their intrinsic delay. Advantageously, the invention can be used on unidirectional and bi-directional lines.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following Claims and their equivalents.

What is claimed is:

1. A circuit for accelerating digital signal transitions, comprising:

a common input/output node to receive a digital input signal and transmit a digital output signal;

a transition termination circuit connected to said common input/output node to generate a transition termination signal when said digital input signal approaches a final signal level; and a transition acceleration circuit connected to said common input/output node and said transition termination circuit, said transition acceleration circuit being activated to accelerate said digital input signal to a full digital signal level when said digital input signal achieves an initial signal transition level and being deactivated when said transition termination signal is received and thereby transmitting to said common input/output node said digital output signal.

2. The circuit of claim 1 wherein said transition termination circuit comprises:

a first transition termination circuit to generate said transition termination signal in response to a low-to-high digital input signal that achieves a predetermined digital high signal level; and, a second transition termination circuit to generate said transition termination signal in response to a high-to-low digital input signal that achieves a predetermined digital low signal level.

3. The circuit of claim 2 further comprising:

a signal driver circuit connected between said transition termination circuit and said transition acceleration circuit to contribute to a desired acceleration time.

4. The circuit of claim 3 wherein said signal driver circuit comprises:

a first signal driver circuit to drive said transition termination signal from said first transition termination circuit; and a second signal driver circuit to drive said transition termination signal from said second transition termination circuit.

5. The circuit of claim 4 wherein said first signal driver circuit and said second signal driver circuit are each implemented with a set of inverters.

6. The circuit of claim 1 wherein said transition acceleration circuit comprises:

a low-to-high transition acceleration circuit; and a high-to-low transition acceleration circuit.

7. The circuit of claim 6 wherein said low-to-high transition acceleration circuit is implemented with a logical NAND gate and said high-to-low transition acceleration circuit is implemented with a logical NOR gate.

8. The circuit of claim 1 further comprising an output stage circuit connected between said transition acceleration circuit and said common input/output node.

9. The circuit of claim 8 wherein said output stage circuit comprises a first output stage circuit and a second output stage circuit.

10. The circuit of claim 9 wherein said first output stage circuit is implemented with a pull-up transistor and said second output stage circuit is implemented with a pull-down transistor.

11. The circuit of claim 1 connected within a central processing unit of a general purpose computer.

12. A circuit for accelerating digital signal transitions, comprising:

a common input/output node to alternately receive low-to-high digital input signals and high-to-low digital input signals;

a transition termination circuit connected to said common input/output node to generate a transition termination signal when a received low-to-high digital input signal achieves a predetermined digital high signal level below a standard digital high signal level and when a received high-to-low digital input signal achieves a predetermined digital low signal level above a standard digital low signal level; and a transition acceleration circuit connected to said common input/output node and said transition termination circuit to accelerate said received low-to-high digital input signal to a high digital signal level from the time that said received low-to-high digital input signal achieves a minimally high digital signal level until said transition termination signal is received, and accelerate said received high-to-low digital input signal to a low digital signal level from the time that said received high-to-low digital input signal achieves a minimally low digital signal level until said transition termination signal is received.

13. The apparatus of claim 12 further comprising:

a signal driver circuit connected between said transition termination circuit and said transition acceleration circuit.

14. The apparatus of claim 12 wherein said transition acceleration circuit comprises:

a low-to-high transition acceleration circuit; and a high-to-low transition acceleration circuit.

15. The apparatus of claim 14 wherein said low-to-high transition acceleration circuit is implemented with a logical NAND gate and said high-to-low transition acceleration circuit is implemented with a logical NOR gate.

16. The apparatus of claim 12 further comprising an output stage circuit connected between said transition acceleration circuit and said common input/output node.

17. The circuit of claim 12 connected within a central processing unit of a general purpose computer.

* * * * *

UNITED STATES PATENT AND TRADEMARK OFFICE
CERTIFICATE OF CORRECTION

PATENT NO. : 6,091,259
DATED : July 18, 2000
INVENTOR(S) : Willem J. DeLange

It is certified that error appears in the above-identified patent and that said Letters Patent is hereby corrected as shown below:

Column 6, line 8, delete "when", and insert --solely in response to--; and
Column 7, line 6, after "signal", insert -- solely in response to said low-to-high digital input signals and said high-to-low digital input signals, said transition termination circuit generating a transition termination signal--.

Signed and Sealed this

First Day of May, 2001

Attest:

NICHOLAS P. GODICI

*Attesting Officer*   *Acting Director of the United States Patent and Trademark Office*